United States Patent
Lee et al.

(10) Patent No.: US 8,527,856 B2
(45) Date of Patent: Sep. 3, 2013

(54) ENCODING APPARATUS AND METHOD USING TURBO CODE, AND PERMUTATION UNIT AND METHOD

(75) Inventors: In Ki Lee, Busan (KR); Nam Soo Kim, Busan (KR); Ji Won Jung, Busan (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 462 days.

(21) Appl. No.: 12/942,321

(22) Filed: Nov. 9, 2010

(65) Prior Publication Data
US 2011/0113308 A1   May 12, 2011

(30) Foreign Application Priority Data

Nov. 9, 2009 (KR) .................. 10-2009-0107675
May 7, 2010 (KR) .................. 10-2010-0043177

(51) Int. Cl.
*H03M 13/03* (2006.01)

(52) U.S. Cl.
USPC ........................ 714/790; 714/752; 714/786

(58) Field of Classification Search
None
See application file for complete search history.

(56) References Cited

U.S. PATENT DOCUMENTS

| | | | | |
|---|---|---|---|---|
| 6,044,116 A | * | 3/2000 | Wang | 375/265 |
| 6,621,871 B2 | * | 9/2003 | Ross et al. | 375/262 |
| 6,665,833 B1 | * | 12/2003 | Tong et al. | 714/790 |
| 2002/0166093 A1 | * | 11/2002 | Eroz et al. | 714/755 |
| 2011/0320920 A1 | * | 12/2011 | Sampei et al. | 714/786 |

OTHER PUBLICATIONS

Sason et al., "Coding for Parallel Channels: Gallager Bounds and Applications to Turbo-Like Codes", Jul. 2007, IEEE Transactions on Information Theory, vol. 53, No. 7, pp. 2394-2428.*
Valenti et al., "A Bandwidth Efficient Pilot Symbol Technique for Coherent Detection of Turbo Codes over Fading Channels", 1999, IEEE.*
Catherine Douillard et al., "Turbo Codes With Rate-m/(m+1) Constituent Convolutional Codes" IEEE Transactions on Communications, vol. 53, No. 10, Oct. 2005.
Yingzi Gao, et al., "Triple-binary circular recursive systematic convolutional turbo codes", The 5th International Symposium on Wireless Personal Multimedia Communications, vol. 3, 2002, pp. 951-955.

* cited by examiner

*Primary Examiner* — Gabriel Chu
(74) *Attorney, Agent, or Firm* — Rabin & Berdo, P.C.

(57) ABSTRACT

Disclosed are an apparatus and a encoding method using a turbo code and a unit and a method of permutation. The apparatus for encoding using a turbo code according to an exemplary embodiment of the present invention includes: a first encoder that encodes 3 bits inputted from first to third blocks each of which is formed of N bits respectively, with recursive systematic convolutional codes to output a first parity bit; a permutation unit that permutates the 3 bits; a second encoder that encodes the permutated 3 bits with the recursive systematic convolutional codes to output a second parity bit; and a puncturing unit that optionally removes the first parity bit and the second parity bit in consideration of a coding rate of a predetermined turbo code to control the coding rate.

20 Claims, 3 Drawing Sheets

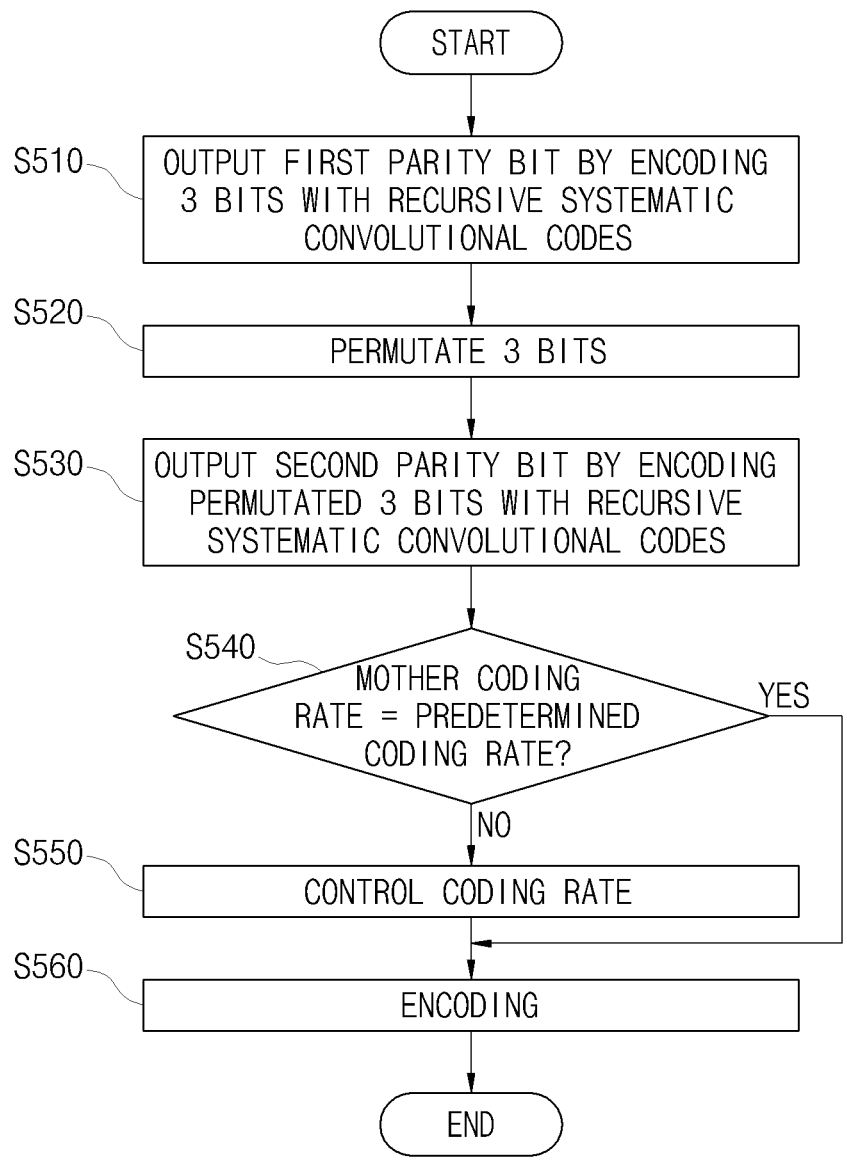

ENCODING APPARATUS AND METHOD USING TURBO CODE, AND PERMUTATION UNIT AND METHOD

CROSS-REFERENCE TO RELATED APPLICATIONS

This application claims priority under 35 U.S.C. §119 to Korean Patent Application No. 10-2009-0107675, filed on Nov. 9, 2009, and No. 10-2010-0043177, filed on May 7, 2010 in the Korean Intellectual Property Office, the disclosure of which is incorporated herein by reference in its entirety.

BACKGROUND OF THE INVENTION

1. Field of the Invention

The present invention relates to an encoding apparatus and an encoding method using a turbo code, and more particularly, to an encoding apparatus and an encoding method using a turbo code capable of improving error correction performance, and a permutation unit and a permutation method of.

2. Description of the Related Art

Generally, digital data may contain errors during transmission due to wired/wireless link/channel noises or other data transmission. For this reason, communication systems use error correction technologies to correct errors occurred during transmission.

A turbo code is a forward error correction (FEC) technology. An encoder using Turbo Code encodes and transmits input blocks using the turbo code, thereby decreases the error occurrence rate during the transmission and corrects the errors.

The turbo code shows better performance as a minimum hamming distance (MHD) gets higher; however, this is largely affected by interleaving, that is, permutation. Hereinafter, a permutation method of turbo code will be briefly described.

First, a uniform or a regular interleaving scheme uses a rectangular matrix scheme, such that the interleaving is performed well even when an error pattern weight is 2 or 3. However, the uniform or the regular interleaving scheme does not change the decoding weight of the decoder, such that it can't improve an error correction performance by the interleaving and is largely affected by the square or rectangular error pattern.

A non-uniform interleaving scheme can disperse the error patterns well, thereby well dispersing code words of each code when the weight of the error pattern is 2 or 3, increasing the decoding weight, and exponentially improving the gain and performance of permutation.

For this reason, the non-uniform interleaving scheme is mainly applied to the turbo code. Among those, a duo-binary turbo code of an RCS standard is evaluated as a strong forward error correction technology, which almost come close limitations of Shannon. However, the duo-binary turbo code generates an error floor phenomenon at a low coding rate. Therefore, there is a need to improve the error floor phenomenon.

SUMMARY OF THE INVENTION

In order to solve the above problems, it is an object of the present invention to provide an apparatus and a encoding method using a turbo code capable of improving error correction capability of a turbo code by increasing a Hamming distance of data inputted as a parallel 3 bit and a unit and a method of permutation thereof.

It is another object of the present invention to provide an apparatus and a encoding method using a turbo code capable of providing a method of permutation that can increase a Hamming distance of data inputted as a parallel 3 bit and a unit and a method of permutation.

According to an aspect of the present invention, there is provided an apparatus for encoding using a turbo code, including: a first encoder that encodes 3 bits inputted from first to third blocks each of which is formed of N bits respectively, with recursive systematic convolutional codes to output a first parity bit; a permutation unit that permutates the 3 bits; a second encoder that encodes the permutated 3 bits with the recursive systematic convolutional codes to output a second parity bit; and a puncturing unit that optionally removes the first parity bit and the second parity bit in consideration of a coding rate of a predetermined turbo code to control the coding rate.

According to an another aspect of the present invention, there is provided a permutation unit, including: a first permutation unit that mutually exchanges bits of at least two blocks among three blocks when a sequence of 3 bits inputted from the three blocks each of which is formed of N bits respectively, is a multiple of 2; a second permutation unit that confirms a remainder values obtained by dividing the sequence of the mutually exchanged 3 bits by 4 and changes the sequence of the 3 bits within the three blocks in a different manner according to the remainder values; and an enumeration unit that permutates and enumerates the sequence of the bits of the three blocks in the changed sequence.

According to an another aspect of the present invention, there is provided a encoding method using a turbo code, including: encoding 3 bits inputted from first to third blocks each of which is formed of N bits respectively, with recursive systematic convolutional codes to output a first parity bit; permutating the 3 bits in a predetermined manner; encoding the permutated 3 bits with the recursive systematic convolutional codes to output a second parity bit; and optionally removing the first parity bit and the second parity bit to control a coding rate when a mother coding rate according to a combination of the 3 bits, the first parity bit, and the second parity bit is different from a predetermined coding rate.

According to an another aspect of the present invention, there is provided a method of permutation, including: confirming a sequence k (k is a constant that is $0 \leq k \leq N$) of 3 bits when the 3 bits of a first block, a second block, and a third block each of which is formed of N bits, is respectively inputted in parallel; mutually exchanging at least 2 bits among the 3 bits of the three blocks when the sequence of the 3 bits is a multiple of 2; confirming a remainder values obtained by dividing the sequence of the 3 bits by 4 and changing the sequence of the mutually exchanged 3 bits within the three blocks in a different manner according to the remainder values; and permutating and enumerating the sequence of bits of the three blocks in the changed sequence.

BRIEF DESCRIPTION OF THE DRAWINGS

FIG. 5 is a flow chart showing a turbo encoding method according to the exemplary embodiment of the present invention.

DETAILED DESCRIPTION OF THE PREFERRED EMBODIMENTS

Advantages and features of the present invention and methods to achieve them will be elucidated from exemplary embodiments described below in detail with reference to the accompanying drawings. However, the present invention is not limited to exemplary embodiment disclosed herein but will be implemented in various forms. The exemplary embodiments are provided by way of example only so that a person of ordinary skilled in the art can fully understand the disclosures of the present invention and the scope of the present invention. Therefore, the present invention will be defined only by the scope of the appended claims. Meanwhile, terms used in the present invention are to explain exemplary embodiments rather than limiting the present invention. Unless explicitly described to the contrary, a singular form includes a plural form in the present specification. "Comprises" and/or "comprising" used herein does not exclude the existence or addition of one or more other components steps, operations, and elements in addition to the above-mentioned components, operations, and/or elements.

Figure 1:
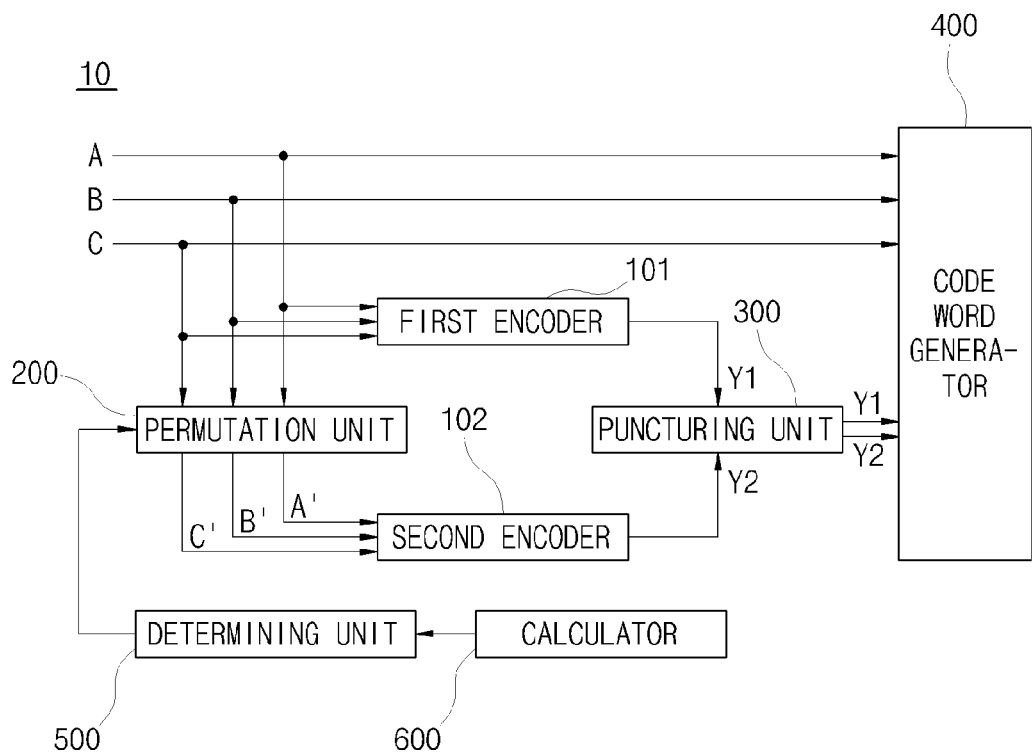
FIG. 1 is a configuration diagram showing an apparatus for encoding using a turbo code according to the exemplary embodiment of the present invention.

Hereinafter, an apparatus for encoding using a turbo code according to an exemplary embodiment of the present invention will be described with reference to FIG. 1. FIG. 1 is a configuration diagram showing an apparatus for encoding using a turbo code according to an exemplary embodiment of the present invention.

As shown in FIG. 1, an apparatus for encoding using a turbo code 10 according to an exemplary embodiment of the present invention includes a first encoder 101, a permutation unit 200, a second encoder 102, a puncturing unit 300, and a code word generator 400.

The first encoder 100 encodes 3 bits input data (A bit, B bit, and C-bit) inputted from a first block, a second block, and a third block respectively, with 8-state or 16-state recursive systematic convolutional codes to output a first parity bit.

At this time, the first block, the second block, and the third block individually include N information bits among the entire 3N information bits. In other words, when the information bits to be encoded is 3N, the first block may include a $1^{st}$ to N-th information bits, the second block include N+1-th to 2N-th information bits, and the third block include 2N+1-th to 3N-th information bits.

The permutation unit 200 performs interleaving, that is, permutation on the input data (A bit, B bit, and C bit) between respective blocks and in each block. The detailed configuration of the permutation unit 200 will be described below with reference to FIG. 2.

The second encoder 102 encodes the permutated input data (A bit, B bit, and C bit) with the 8-state or 16-state recursive systematic convolutional codes to output a second parity bit.

The puncturing unit 300 optionally removes the first parity bit and the second parity bit to control a coding rate of the first block, the second block, and the third block.

For example, the puncturing unit 300 optionally removes the first parity bit and the second parity bit to control the coding rate when the sequence of each bit is odd or even. Thereafter, referring to FIG. 3, the puncturing unit 300 will be described in more detail.

Meanwhile, the code word generator 400 receives 3 bits and the first parity bit or the second parity bit from the puncturing unit 300 to generate the encoded code word.

Meanwhile, the apparatus for encoding using the turbo code 10 according to the exemplary embodiment of the present invention further includes a calculator 600 and a determining unit 500 and may determine variables used in the permutation of the permutation unit 200 by using the calculator 600 and the determining unit 500.

The calculator 500 uses candidates of permutation parameter according to a predetermined coding rate and a state to calculate the minimum hamming distance. And the determining unit 600 determines one of the candidates of the permutation parameter having the largest calculated Hamming distance as the permutation parameter of the permutation unit 200.

Hereinafter, the permutation unit according to the exemplary embodiment of the present embodiment will be described with reference to FIG. 2.

Figure 2:
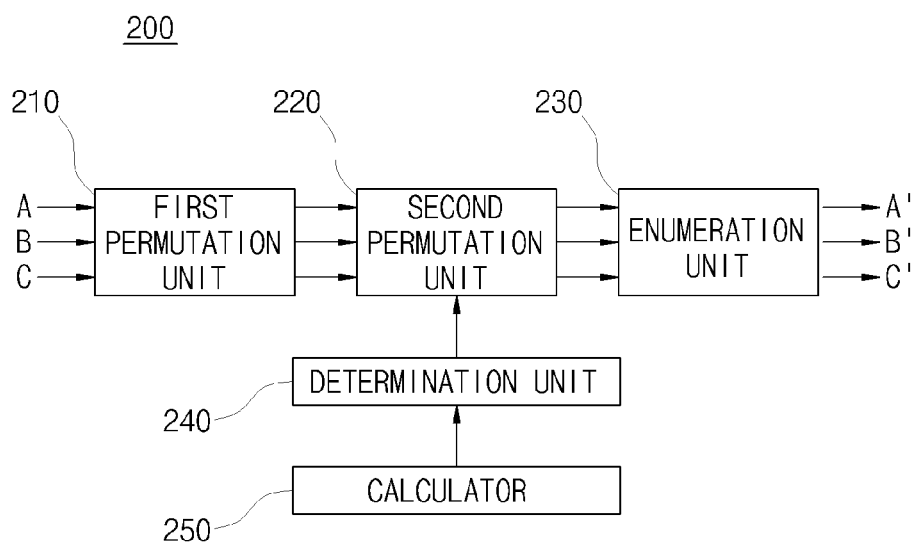
FIG. 2 is a configuration diagram showing a permutation unit according to the exemplary embodiment of the present invention.

FIG. 2 is a configuration diagram showing the permutation unit according to the exemplary embodiment of the present invention.

As shown in FIG. 2, the permutation unit 200 according to the exemplary embodiment of the present invention includes a first permutation unit 210, a second permutation unit 220, and an enumeration unit 230.

The first permutation unit 210 mutually exchanges the bits of two or more blocks (that is, two or more bits of A bit, B bit, and C bit) among the first to third blocks when the sequence of the input data (A bit, B bit, and C bit) is a multiple of 2.

For example, the first permutation unit 210 may mutually exchange the bits of the first block that is the $1^{st}$ block and the third block that is the final block.

The second permutation unit 220 changes the sequence of A bit, B bit, and C bit within the first to third blocks in different manners according to the remainder values obtained by dividing the sequence of A bit, B bit, and C bit permutated by the first permutation unit 210 by 4.

The second permutation unit 220 may change the sequence of A bit, B bit, and C bit according to the following Equation 1. Herein, j is the changed sequence of A bit, B bit, and C bit, k is an original sequence of A bit, B bit, and C bit, P is permutation parameter represented in the following Table 1, and Q is a result value obtained by substituting and calculating the permutation parameter represented in the following Table 1 into the following Equation 2 when the remainder values each are 0, 1, 2, and 3.

$$j = (P \times k + Q + 3) \quad \text{[Equation 1]}$$

$$\text{if}(k \bmod 4 = 0) \rightarrow Q = 0$$

$$\text{if}(k \bmod 4 = 1) \rightarrow Q = Q_0 \text{ (or } P_1)$$

$$\text{if}(k \bmod 4 = 2) \rightarrow Q = 4Q_0 + Q_2 \text{ (or } 4P_1 + P_2)$$

$$\text{if}(k \bmod 4 = 3) \rightarrow Q = 4Q_0 + Q_3 \text{ (or } 4P_1 + P_3) \quad \text{[Equation 2]}$$

The permutation parameter may be variously set according to the predetermined coding rate and the state of permutation. The second permutation unit 220 uses the permutation parameter having a relatively large minimum Hamming distance (MHD) among variously set permutation parameters as shown in the following Table 1.

TABLE 1

|  | Coding rate | | |
|---|---|---|---|
|  | 1/2 | 2/3 | 3/4 |
| 8-state duo-binary turbo code<br>P = 19, $P_1$ = 376, $P_2$ = 224, $P_3$ = 600 | 19 | 12 | 9 |
| 16-state duo-binary turbo code<br>P = 35, $Q_0$ = 1, $Q_1$ = 4, $Q_2$ = 4, $Q_3$ = 12 | 26 | 18 | 12 |

The enumeration unit 230 outputs A' bit, B' bit, and C' bit in the changed sequence by the second permutation unit 220.

Meanwhile, the permutation unit 200 may receive the permutation parameter from an outside. Alternatively, the permutation unit 200 may further include a calculator 240 that calculates the minimum Hamming distance by using the candidates of the permutation parameter respectively according to the predetermined coding rate and the state, and a determining unit 250 that determines one of the candidates of the permutation parameter having the largest calculated minimum Hamming distance as the permutation parameter of the second permutation unit 220.

Figure 3:
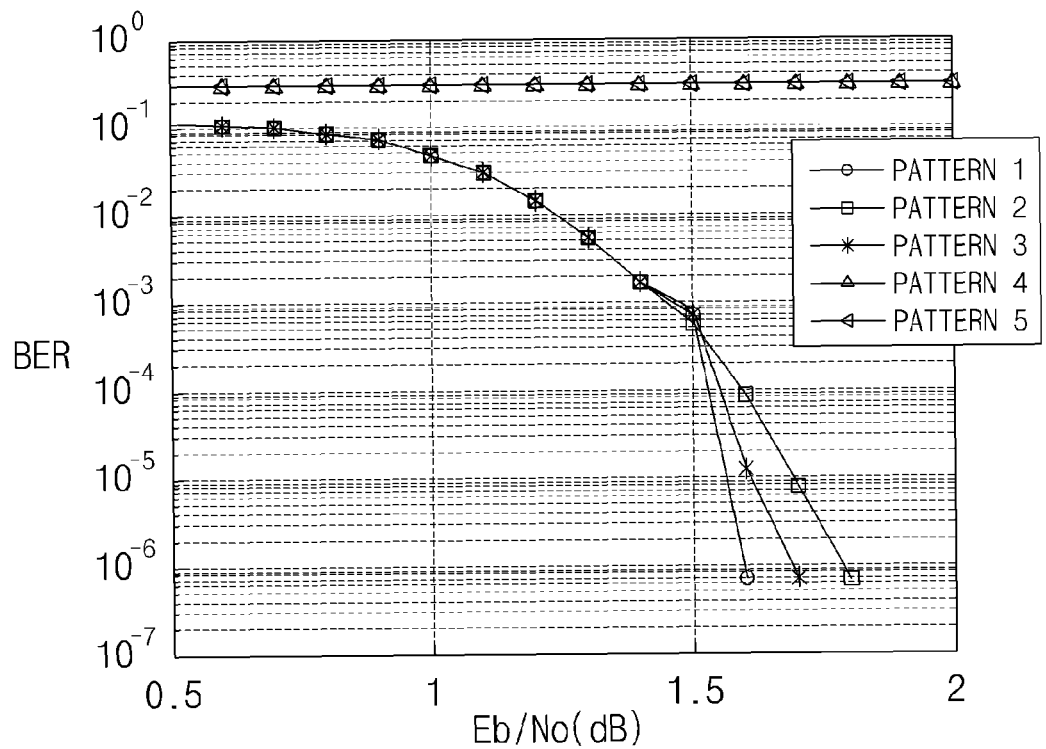
FIG. 3 is a simulation graph showing BER performance according to permutation of the present invention.

Hereinafter, the permutation pattern of the first permutation unit 210 according to the exemplary embodiment of the present invention will be described with reference to FIG. 3. FIG. 3 is a simulation graph showing BER performance when the first permutation unit according to the exemplary embodiment of the present invention uses the permutation patterns (patterns 1 to 5) as shown in the following Table 2.

TABLE 2

| Input data | Pattern 1 | Pattern 2 | Pattern 3 | Pattern 4 | Pattern 5 |
|---|---|---|---|---|---|
| A | C | B | A | C | B |
| B | B | A | C | A | C |
| C | A | C | B | B | A |

It can be appreciated through the graph of FIG. 3 that the performance is the most excellent when the first permutation unit 210 uses pattern 1 that mutually exchanges A bit and C bit among the permutation patterns shown in the above Table 2. Therefore, in the present specification, the case where the first permutation unit 210 uses pattern 1 will be described by way of example.

Figure 4:
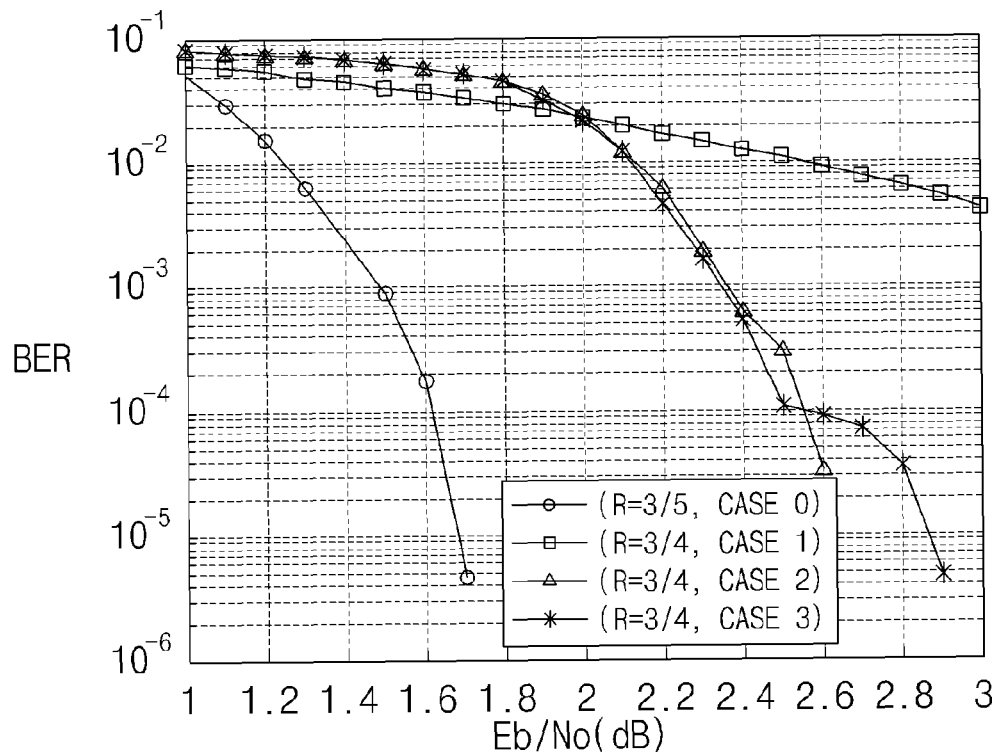
FIG. 4 is a simulation graph showing BER performance according to puncturing of the present invention.

Hereinafter, the puncturing pattern of the puncturing unit 300 according to the exemplary embodiment of the present invention will be described with reference to FIG. 4. FIG. 4 is a simulation graph showing the BER performance when the puncturing unit 300 according to the exemplary embodiment of the present invention uses the puncturing patterns (case 1, case 2, and case 3) as shown in the following Table 3.

FIG. 4 shows, by way of example, the case where the first to third blocks are formed of a total of 4 bits (that is, N=4) and all the bit values of each block are '1'. Alternatively, the case where the duo-binary turbo code according to the RSC standard is used and the puncturing is performed at a 3/4 coding rate in the 16-state turbo code which of the mother coding rate is 3/5 will be described by way of example.

TABLE 3

|  | Input data | | Parity bit | |
|---|---|---|---|---|
| CASE 1 | A | 1111 | Y1 | 1111 |
|  | B | 1111 | Y2 | 0000 |
|  | C | 1111 | | |

TABLE 3-continued

|  | Input data | | Parity bit | |
|---|---|---|---|---|
| CASE 2 | A | 1111 | Y1 | 0101 |
|  | B | 1111 | Y2 | 1010 |
|  | C | 1111 | | |
| CASE 3 | A | 1111 | Y1 | 1010 |
|  | B | 1111 | Y2 | 0101 |
|  | C | 1111 | | |

It can be appreciated from the graph of FIG. 4 that the BER performance is the most excellent when the puncturing pattern of case 2 is applied rather than when the puncturing pattern of case 1 and the puncturing pattern of case 3 are applied. Therefore, the present specification described by way of example, the case where the puncturing unit 300 applies the puncturing pattern of case 2.

Of course, the BER performance of case 0 (the case where the mother coding rate is 3/5) that does not perform the puncturing is more excellent than that of cases 1, 2, and 3 that perform the puncturing by performing the permutation of the present invention, but when the transmission efficiency is considered, the puncturing should be performed in most cases. Therefore, the present invention applies the puncturing of the pattern that does not largely degrade the BER performance as compared to the mother coding rate even though the coding rate is controlled.

Hereinafter, a turbo encoding method according to the exemplary embodiment of the present embodiment will be described with reference to FIG. 5. FIG. 5 is a flow chart showing a turbo encoding method according to the exemplary embodiment of the present invention.

Referring to FIG. 5, the apparatus for encoding using the turbo code 10 encodes A bit, B bit, and C bit with the recursive systematic convolutional codes to output the first parity bit (S510).

Then, the apparatus for encoding using the turbo code 10 permutates 3 bits in the predetermined manner (S520). In other words, the apparatus for encoding using the turbo code 10 mutually exchanges the bits of one block and another block within the first to third blocks when the sequence of 3 bits is a multiple of 2 and permutates the sequence of the mutually exchanged bits within a block including the mutually exchanged bits in the above-mentioned manner according to the remainder value obtained by dividing the sequence of 3 bits by 4.

Next, the apparatus for encoding using the turbo code 10 encodes the permutated 3 bits with the recursive systematic convolutional codes to output the second parity bit (S530).

Thereafter, the apparatus for encoding using the turbo code 10 confirms whether the mother coding rate according to a combination of 3 bits, the first parity bit, and the second parity bit is the same as the predetermined coding rate (S540).

The apparatus for encoding using the turbo code 10 performs the turbo code encoding on 3 bits, the first parity bit, and the second parity bit if it is determined that the mother coding rate according to the combination is the same as a predetermined coding rate (S560).

On the other hand, the apparatus for encoding using the turbo code 10 optionally removes the first parity bit and the second parity bit through the puncturing to control the coding rate when the mother coding rate is different from the predetermined coding rate (S550).

As described above, the present invention applies the puncturing method and the permutation method to the data inputted as the parallel 3 bits, thereby making it possible to increase the minimum Hamming distance to 50% or more than the 2-input turbo code of related art due to the encoding results using the turbo code. Therefore, the present invention can largely improve the error correction performance of the transmitting and receiving data as compared to the case when the turbo code of the related art is used.

While configurations of certain embodiments have been described above with reference to the accompanying drawings, it is by way of example only. Those skilled in the art can make various modifications and changes within the technical spirit of the present invention. Accordingly, the actual technical protection scope of the present invention must be determined by the spirit of the appended claims.

What is claimed is:

1. An encoding apparatus using a turbo code, comprising:
   a first encoder that encodes 3 bits inputted from first to third blocks each of which is formed of N bits respectively, with recursive systematic convolutional codes to output a first parity bit;
   a permutation unit that permutates the 3 bits;
   a second encoder that encodes the permutated 3 bits with the recursive systematic convolutional codes to output a second parity bit; and
   a puncturing unit that optionally removes the first parity bit and the second parity bit in consideration of a coding rate of a predetermined turbo code to control the coding rate.

2. The encoding apparatus according to claim 1, wherein the permutation unit mutually exchanges bits of one block and another block among the first to third blocks when a sequence of the 3 bits is a multiple of 2, and permutates the sequence of the mutually exchanged bits within a block including the mutually exchanged bits, according to a remainder values obtained by dividing the sequence of the 3 bits by 4.

3. The encoding according to claim 2, further comprising:
   a calculator that calculates a minimum Hamming distance using candidates of a permutation parameter according to the predetermined coding rate and a state; and
   a determining unit that determines one of the candidates having the largest calculated minimum Hamming distance as the permutation parameter of the permutation unit.

4. The encoding apparatus according to claim 3, wherein the permutation unit permutates the sequence of the mutually exchanged bits using an Equation $j=(P*k+Q+3) \mod N$ that provides different result values according to the remainder values (where, k is the sequence of the 3 bits, P is the permutation parameter, and Q is a constant determined by the permutation parameter and the remainder value).

5. The encoding apparatus according to claim 1, wherein the puncturing unit optionally removes the first parity bit and the second parity bit to control the coding rate when the sequence of the 3 bits is odd or even.

6. The encoding apparatus according to claim 5, wherein the puncturing unit removes the first parity bit when the sequence is odd and removes the second parity bit when the sequence is even.

7. The encoding apparatus according to claim 1, further comprising a code word generator that receives the 3 bits and the first parity bit or the second parity bit from the puncturing unit to generate the encoded code word.

8. A permutation unit, comprising:
   a first permutation unit that mutually exchanges bits of at least two blocks among three blocks when a sequence of 3 bits inputted from the three blocks each of which is formed of N bits respectively, is a multiple of 2;
   a second permutation unit that confirms a remainder values obtained by dividing the sequence of the mutually exchanged 3 bits by 4 and changes the sequence of the 3 bits within the three blocks in a different manner according to the remainder values; and
   an enumeration unit that permutates and enumerates the sequence of the bits of the three blocks in the changed sequence.

9. The permutation unit according to claim 8, wherein the first permutation unit mutually exchanges bits of the first block and a final block among the three blocks.

10. The permutation unit according to claim 8, further comprising:
    a calculator that calculates a minimum Hamming distance using candidates of a permutation parameter respectively according to a predetermined coding rate and a state; and
    a determining unit that determines one of the candidates having the largest calculated minimum Hamming distance as the permutation parameter of the second permutation unit.

11. The permutation unit according to claim 10, wherein the second permutation unit performs a predetermined calculation using the remainder values, the permutation parameter, and the sequence of the 3 bits to change the sequence of the 3 bits.

12. An encoding, with a hardware encoder, method using a turbo code, comprising:
    encoding 3 bits inputted from first to third blocks respectively each of which is formed of N bits, with recursive systematic convolutional codes to output a first parity bit;
    permutating the 3 bits in a predetermined manner;
    encoding the permutated 3 bits with the recursive systematic convolutional codes to output a second parity bit; and
    optionally removing the first parity bit and the second parity bit to control a coding rate when a mother coding rate according to a combination of the 3 bits, the first parity bit, and the second parity bit is different from a predetermined coding rate.

13. The encoding method according to claim 12, further comprising receiving the first parity bit or the second parity bit together with the 3 bits to generate an encoded code word.

14. The encoding method according to claim 12, wherein the permutating includes mutually exchanging bits of one block and another block among the first to third blocks when a sequence of the 3 bits is a multiple of 2, and permutating the sequence of the mutually exchanged bits within a block including the mutually exchanged bits, according to a remainder values obtained by dividing the sequence of the 3 bits by 4.

15. The encoding method according to claim 14, wherein the permutating includes permutating the sequence of the mutually exchanged bits using Equation $j=(P*k+Q+3) \mod N$ that provides different result values according to the remainder values (where, k is the sequence of the 3 bits, P is a permutation parameter, and Q is a constant determined by the permutation parameter and the remainder value).

16. The encoding method according to claim 15, further comprising:
    calculating a minimum Hamming distance using candidates of the permutation parameter according to a predetermined coding rate and a state; and
    determines one of the candidates having the largest calculated minimum Hamming distance as the permutation parameter of the second permutation unit.

17. The encoding method according to claim 12, wherein the controlling includes removing the first parity bit when the sequence is odd, and removing the second parity bit when the sequence is even.

18. A method of permutation, comprising:
confirming, with hardware, a sequence k (k is a constant that is $0 \leq k \leq N$) of 3 bits when the 3 bits of a first block, a second block, and a third block, each of which is formed of N bits is respectively inputted in parallel;
mutually exchanging at least 2 bits among the 3 bits of the three blocks when the sequence of the 3 bits is a multiple of 2;
confirming a remainder values obtained by dividing the sequence of the 3 bits by 4 and changing the sequence of the mutually exchanged 3 bits within the three blocks in a different manner according to the remainder values; and
permutating and enumerating the sequence of bits of the three blocks in the changed sequence.

19. The method of permutation according to claim 18, wherein the mutually exchanging includes mutually exchanging the 2 bits of the first block and a final block among the three blocks.

20. The method of permutation according to claim 18, wherein the changing includes:
determining the permutation parameter in consideration of a minimum Hamming distance according to a predetermined coding rate and a state; and
changing the sequence of the mutually exchanged 3 bits by performing a predetermined calculation using the remainder value, the sequence of the 3 bits, and the permutation parameter.

* * * * *